(12) United States Patent
Doescher

(10) Patent No.: US 6,998,839 B2
(45) Date of Patent: Feb. 14, 2006

(54) MAGNETORESISTIVE SENSOR HAVING A STRIP-SHAPED CONDUCTOR AND A SCREENING STRIP

(75) Inventor: Michael Doescher, Hamburg (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 152 days.

(21) Appl. No.: 10/323,229

(22) Filed: Dec. 18, 2002

(65) Prior Publication Data
US 2003/0128031 A1  Jul. 10, 2003

(30) Foreign Application Priority Data
Dec. 20, 2001  (DE) .................. 101 62 752

(51) Int. Cl.
G01R 33/02  (2006.01)

(52) U.S. Cl. ............... 324/252; 324/207.21; 338/32 R
(58) Field of Classification Search .......... 324/207.21, 324/207.22, 252, 166, 165, 207.25; 338/32 R
See application file for complete search history.

(56) References Cited

U.S. PATENT DOCUMENTS

| | | | | |
|---|---|---|---|---|
| 5,684,397 A | * | 11/1997 | Ishishita | 324/252 |
| 5,689,185 A | * | 11/1997 | Widdershoven et al. | 324/252 |
| 5,708,407 A | * | 1/1998 | Mouchot et al. | 338/32 R |
| 6,727,694 B1 | * | 4/2004 | Doescher | 324/252 |

FOREIGN PATENT DOCUMENTS

| WO | WO9528649 | 10/1995 |
|---|---|---|
| WO | WO9857188 | 12/1998 |

* cited by examiner

Primary Examiner—Bot Ledynh
Assistant Examiner—Reena Aurora

(57) ABSTRACT

A magnetoresistive sensor has at least one strip-shaped conductor that is formed from a magnetoresistive material and that is designed to determine its electrical resistance, which can be influenced by an external magnetic field, and/or to be acted on by an electric current. In order to construct a magnetoresistive sensor of this type in such a way that a further reduction in the hysteresis and an improved linearity are obtained, at least one screening strip is provided according to the invention that is disposed at least substantially parallel to and at a predetermined spacing from the conductor and is electrically separated from it.

3 Claims, 4 Drawing Sheets

MAGNETORESISTIVE SENSOR HAVING A STRIP-SHAPED CONDUCTOR AND A SCREENING STRIP

Figure 1:
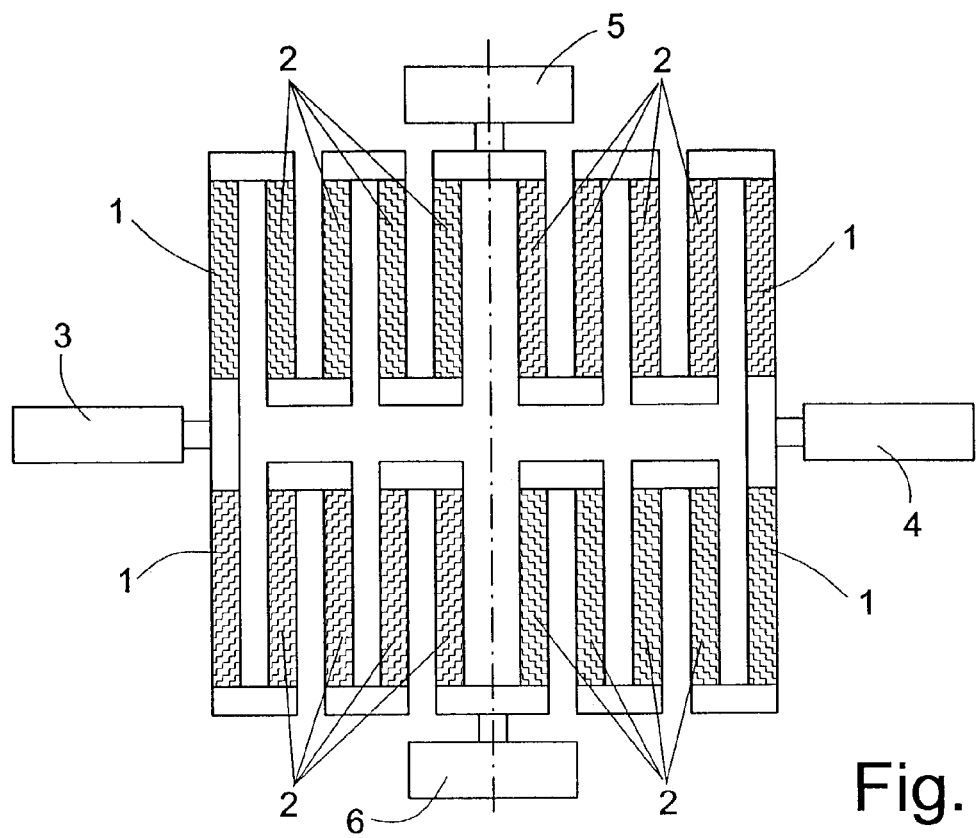

The invention relates to a magnetoresistive sensor having at least one strip-shaped conductor that is formed from a magnetoresistive material and that is designed to determine electrical resistance, which can be influenced by an external magnetic field, and/or to be acted on by an electric current.

Such sensors are preferably used for magnetic field, current, position and movement measurements. A particular application field in this connection is angular and rotational-speed measurements on, for example, camshafts and crankshafts for various control systems in internal combustion engines.

WO 98/57188 A1 discloses a sensor that comprises a substrate on which a plurality of resistance elements are disposed in a Wheatstone bridge circuit, at least one of the resistance elements exhibiting a magnetoresistive effect. The resistance elements are disposed in branches that make the following connections: (a) a current input terminal with a first voltage terminal; (b) the first voltage terminal with a current output terminal; (c) the current output terminal with a second voltage terminal; (d) the second voltage terminal with the current input terminal. In this design, the sensor comprises a second Wheatstone bridge circuit that is electrically connected to the described first Wheatstone bridge circuit. Both Wheatstone bridge circuits are identical with the exception of the feature that, if an output signal of a particular magnetoresistive element in a particular branch in one of the Wheatstone bridge circuits has a positive polarity, the output signal of the magnetoresistive element corresponding thereto in the same branch of the other Wheatstone bridge circuit exhibits a negative polarity. In particular, in said sensor, the branches are constructed with AMR elements, the elements of the two Wheatstone bridge circuits being interleaved with one another in a space-saving manner and being accommodated on the substrate aligned parallel to one another.

WO 95/28649 A1 discloses a magnetic field sensor constructed from magnetoresistive elements disposed in layer form. The magnetoresistive elements are disposed in a bridge circuit on a substrate. Each magnetoresistive element comprises a meander-shaped conductor structure having conductor strips of magnetoresistive material. The magnetoresistive elements comprise two ferromagnetic layers that exhibit a single-axis anisotropy in one plane and are separated from one another by a non-ferromagnetic layer. During the production of the sensor, the magnetization directions of said ferromagnetic layers are set in such a way that two elements in two adjacent branches of the bridge circuit exhibit opposite sensitivities to external magnetic fields. In addition, in each of the magnetoresistive elements, the magnetization of one of the ferromagnetic layers is set essentially at right angles to the magnetization of the other ferromagnetic layer. Consequently, auxiliary fields for measuring small magnetic field strengths are superfluous; the characteristic curve of the sensor is largely free of hysteresis and exhibits an improved linearity.

It has been found that, for some applications, the characteristic-curve properties achieved in such sensors, in particular hysteresis and deviation from linearity still present, do not meet the requirements.

It is an object of the invention to construct a magnetoresistive sensor of the type mentioned at the outset in such a way that a further reduction in the hysteresis and an improved linearity are achieved.

According to the invention, this object is achieved in a magnetoresistive sensor of the generic kind by at least one screening strip disposed at least substantially parallel to and at a predetermined spacing from the conductor and electrically separated from the latter.

According to the invention, in particular in the case of a magnetoresistive sensor having an arrangement of at least two strip-shaped conductors that are formed from a magnetoresistive material and of which at least two extend essentially parallel to one another and of which at least one of the conductors, described as a peripheral strip, forms a boundary of the arrangement of conductors, the object set is achieved in that the arrangement of the conductors is bounded by at least one of the screening strips, which is disposed at least substantially parallel to and at a predetermined spacing from the at least one peripheral strip and is electrically insulated from the latter.

The invention is based on the insight that hysteresis properties and linearity of the characteristic curve of a sensor provided in accordance with the generic kind having at least one strip-shaped conductor formed from a magnetoresistive material depend essentially on the uniformity with which the applied magnetic field acts on the conductor. This relates, in particular, to sensors that have an arrangement of a plurality of such conductors, i.e. an assembly of magnetoresistive strips that are connected electrically in parallel or in series. During operation, the individual characteristic curves of all the strips connected together in this way are then superimposed to form a resultant characteristic curve of the sensor. In order to achieve optimum sensor properties, in particular in regard to the parameters of hysteresis, of magnetic "hardness" and of sensitivity, it is found that all said strips connected together should respond in an identical way to the applied magnetic field, apart from an optionally desired inversion of the characteristic curve of individual strips or conductors by an appropriate arrangement and alignment of a so-called barber-pole structure known per se.

The sensors disclosed in the above-mentioned publications contain no precautions of any kind for achieving as homogeneous as possible an action of the magnetic field on the individual conductor along its extension or on the various conductors of a plurality of conductors. On the contrary, it emerges on more precise investigation that, on the one hand, a homogeneous action does not exist along the entire extension of such a conductor and that, on the other hand, a non-homogeneous action can occur from conductor to conductor in a plurality of such conductors. As a result, not all the parts of a conductor and not all the conductors respond to the applied magnetic field in a mutually identical way, which results in hysteresis, non-linearity and increased characteristic curve noise. These signal errors limit the precision with which the magnetic field can be measured by the sensor.

In an arrangement of a sensor comprising a plurality of strip-shaped conductors of the type described that are formed from a magnetoresistive material, it has been found, in particular, that one of the conductors, described as a peripheral strip, which forms the boundary of the arrangement of conductors, has a characteristic curve that deviates from the characteristic curve of those of the conductors that extend in the "interior" of the arrangement of conductors. Whereas a hysteresis characteristic curve having steep edges and an unambiguous, reproducible hysteresis behavior results for these "internal" conductors, which hysteresis characteristic curve is displayed as a function of the magnetic induction B, which is formed, of the field strength H of the applied magnetic field, peripheral strips exhibit a flat, inclined hysteresis characteristic curve.

The reason for this different behavior has been found to be different demagnetization fields that are built up in the surroundings of the conductors with different demagnetization field strength and, consequently act on said conductors differently. Such demagnetization fields arise as a result of external interference fields, but also as a result of the magnetic fields of electric currents flowing in adjacent conductors. At the same time, the currents flowing in the strip-shaped sensor conductors formed from magnetoresistive material basically act in the same way as currents in conductor arrangements not belonging to the sensor but adjacent to it, for example supply leads, trimming structures and the like. In particular, in an arrangement comprising a plurality of strip-shaped conductors extending essentially parallel to one another, essentially homogeneous demagnetization fields are, as a rule, built up along the "internal" conductors whereas the demagnetization fields acting on the peripheral strips deviate, as a rule, markedly therefrom.

Even in the case of a sensor having only a single strip-shaped conductor formed from magnetoresistive material, said conductor may be exposed, along its extension, to these said different demagnetization fields, which possibly also fluctuate with time, which also results in a more flatly inclined hysteresis characteristic curve and an impaired linearity for such a configuration.

In particular, it has been found that the non-homogeneous demagnetization fields described result in domain formation in the strip-shaped conductors formed from magnetoresistive material. The individual domains produced under these circumstances and having different effects on the non-homogeneous demagnetization fields have different switching behavior during operation, which results in the altered hysteresis characteristic curves of conductors influenced in this way. Under these circumstances, demagnetization fields that are locally non-homogeneous in this way promote, on the one hand, the formation of domain separations within a single conductor and, on the other hand, a different magnetic "hardness" of individual regions of the conductor produced in this way.

The demagnetization fields that are non-homogeneous locally, i.e. in the region of the spatial extension of the conductors belonging to the sensor, bring about, under these circumstances, not only a reduction in the linearity of the characteristic curve of the sensor provided with at least one strip-shaped conductor formed from magnetoresistive material, i.e. a reduction in the linear characteristic region of said sensor, in particular of such a sensor provided with barberpole structures, but also increased noise in the sensor since all the single domains may exhibit a magnetically different switching behavior, which also results in an increased hysteresis of the characteristic curve of the sensor.

Following this insight, the invention now provides, in a simple way, measures that ensure that the demagnetization fields act essentially almost identically on all the conductors electrically connected to form the sensor and formed form magnetoresistive material, with the result that the electric currents in the conductors forming the sensor are not unfavorably influenced by non-homogeneous demagnetization fields in the region of the spatial extension of the conductors belonging to the sensor.

The homogenization of the magnetic fields acting on all the strip-shaped sensor conductors formed from magnetoresistive material, i.e. in particular the demagnetization fields, is achieved by the arrangement according to the invention of the electrically separated screening strips.

If such a magnetoresistive sensor comprises an arrangement of at least two strip-shaped conductors formed from a magnetoresistive material, of which at least two extend essentially parallel to one another and of which at least one of the conductors, described as a peripheral strip, forms a boundary of the arrangement of conductors, the arrangement of conductors is advantageously bounded by at least one of the screening strips that is disposed at least substantially parallel to and at a predetermined spacing from the at least one peripheral strip and is electrically insulated from it. In this connection, in a preferred development of the invention, the peripheral strip is formed by one of the at least two conductors extending essentially parallel to one another.

In this way, in the sensor described, the screening strips are also assigned as adjacent, strip-shaped elements to the respective "marginal" conductors. Said screening strips achieve the result that all the strip conductors electrically connected to form the sensor and made of magnetoresistive material are situated in the "interior" of a conductor configuration. The magnetic properties of said conductors, in particular, for example, in relation to hysteresis, linearity and sensitivity, become at least almost identical as a result of these measures, apart from deviations due to manufacture, which can, however, be kept in very narrow limits with the current photolithographic production methods for conductors of the type described. On the other hand, the strips whose magnetic properties deviate from those of the strip-shaped conductors electrically connected to form the sensor in the way described are not electrically connected to the sensor, and therefore cannot have a disturbing effect on the output signal of the sensor.

As a result of the screening strips, not only do the demagnetization fields become at least almost identical for all the strip-shaped conductors connected to form the sensor, but interfering external magnetic fields, such as may be caused, for example, by supply conductors, trimming structures and the like, are at least largely screened from the strip-shaped conductors electrically connected to form the sensor. Such trimming structures may likewise be built up at least partially with magnetoresistive material. Their influence on the strip-shaped conductors electrically connected to form the sensor may turn out to be different as a result of shaping and spatial position. At the same time, the trimming structures generate magnetic fields that, in adjacent conductors of magnetoresistive materials, result in the domain separation described, which in turn causes the increased hysteresis described.

In accordance with a further development of the magnetoresistive sensor according to the invention, in which at least a selected plurality of the conductors comprised by the arrangement of at least two strip-shaped conductors formed from a magnetoresistive material and extending essentially parallel to one another is combined to form at least one group of conductors that forms at least one branch in each case of an electrical circuit, at least one of the groups of conductors is bounded by at least one screening strip in each case. This configuration performs a common screening of at least some of the strip-shaped conductors electrically connected to form the sensor. Preferably, this performs a common screening of all the strip-shaped conductors electrically connected to form the sensor by one or more common screening strips.

According to a further development of the invention, each branch of the electric circuit is bounded by at least one screening strip in each case. Preferably, such a measure performs a separate screening of every individual branch of the circuit. Consequently, interfering influences of the conductors of different branches on one another can also be reduced or at least largely suppressed.

In a magnetoresistive sensor of the above-described type, preferably at least almost all the conductors can be disposed at least essentially parallel to one another. Such a configuration is preferably used for rotational-speed sensors. It makes possible a particularly simple construction of the screening strips parallel to the conductors.

In a magnetoresistive sensor of the above-described type, the spacings of the at least one screening strip from the at least one peripheral strip are mutually equal at least almost to the spacings of at least two of the conductors extending essentially parallel to one another. This is applicable both in the case in which a screening is provided separately for each individual group or for each individual branch of the circuit, and if a common screening of the entire sensor is provided. If a common screening of the entire sensor is provided, said spacings are preferably also equal to the spacings of every two conductors assigned to different branches and thereby forming a peripheral strip for that branch to which they are assigned. If at least one screening strip in each case is disposed between said two adjacent peripheral strips, the spacings of each of said two adjacent peripheral strips from the said screening strips are also mutually equal and are equal to the spacings of the other conductors.

In a magnetoresistive sensor based on another embodiment of the invention, at least almost all the conductors of at least one of the branches of the electric circuit in each case are disposed at least essentially parallel to one another. In this connection, the conductors of different branches may have different alignments. Such a configuration is used, in particular, in angle sensors, for which, preferably, a rotationally symmetrical arrangement of the branches is chosen. The conductors of one branch in each case are in that case essentially mutually parallel, but the alignment of the conductors changes from branch to branch.

In such a sensor, a separate screening is preferably provided for every single group or every single branch of the circuit. Particularly preferably, in such an arrangement, the spacings of the at least one screening strip from the at least one peripheral strip of at least one of the branches of the electric circuit in each case are mutually equal at least substantially to the spacings of at least two of the conductors, extending essentially parallel to one another, of said one of the branches of the electric circuit. This choice of spacing achieves a particularly good homogenization.

The invention advantageously achieves a reduction in the variation of the magnetic-field-sensitive properties of the individual constituents of a sensor, i.e. of its individual magnetoresistive conductors or conductor segments, of the type described. This results in an increased reproduction precision of the resultant output signals of the sensor formed in the manner according to the invention, in particular in the case of the measurement of magnetic fields of low magnetic field strengths. The increased reproduction precision effects a reduction in the signal fluctuations of the output signals, a larger linear region of the characteristic curve of the sensor, a reduced hysteresis and also a reduction in the noise.

Figure 2:
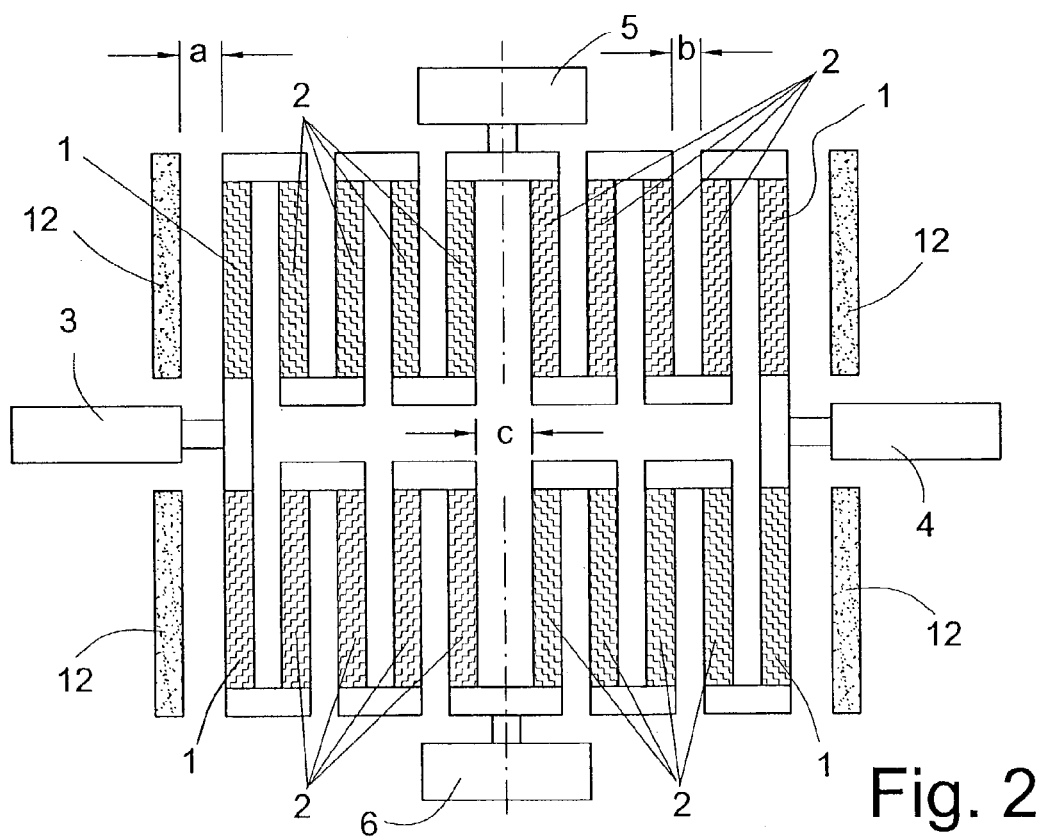
Figure 3:
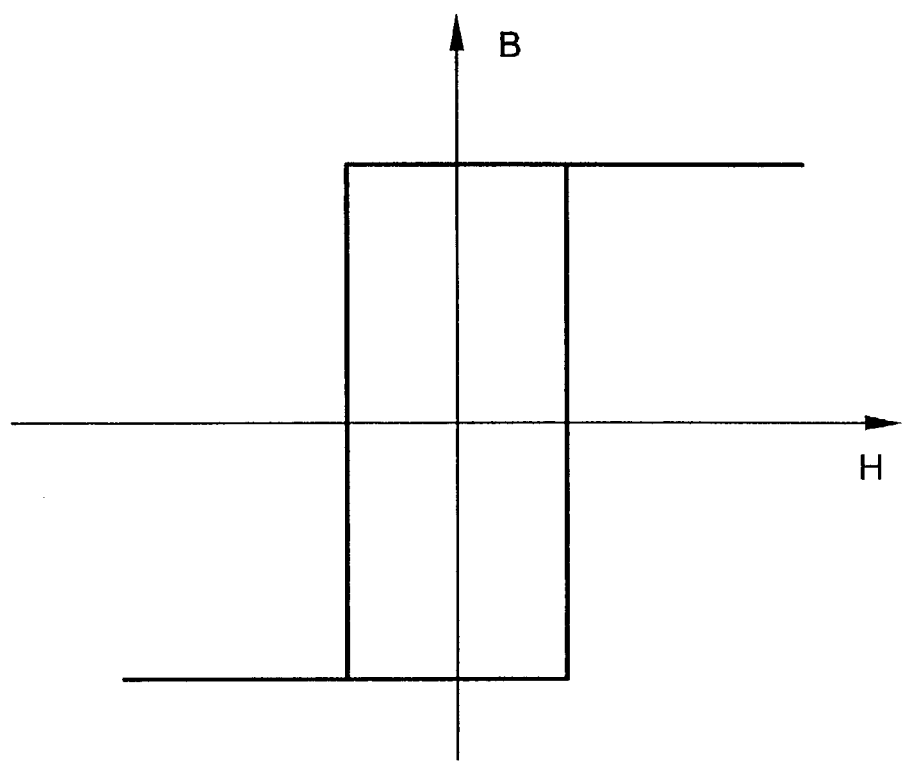
Figure 4:
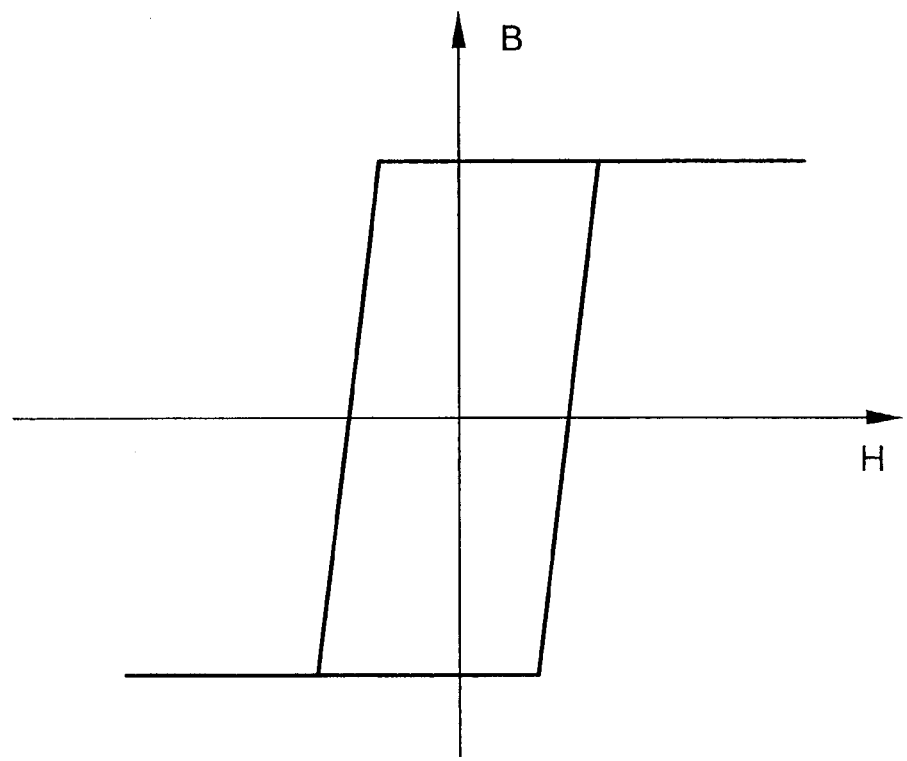
Figure 5:
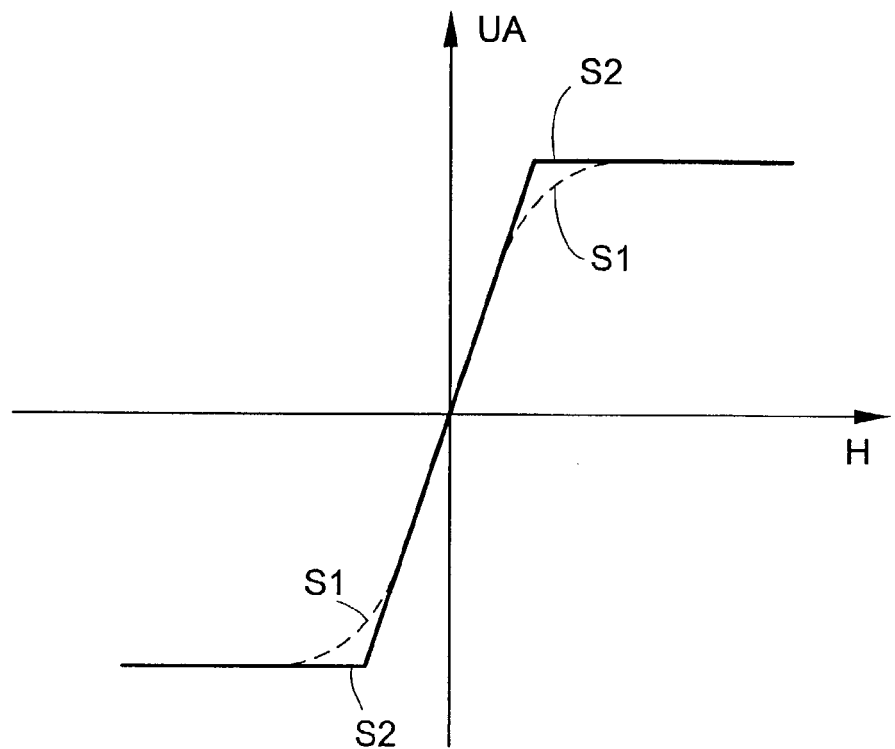
Figure 6:
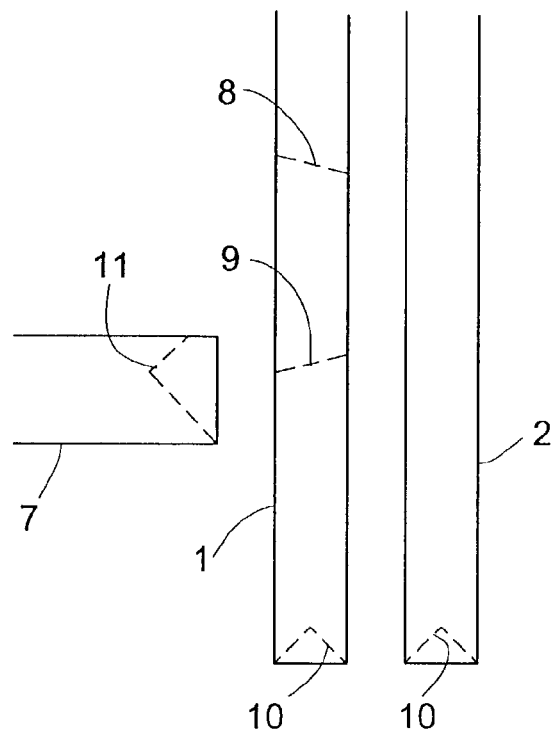
Figure 7:
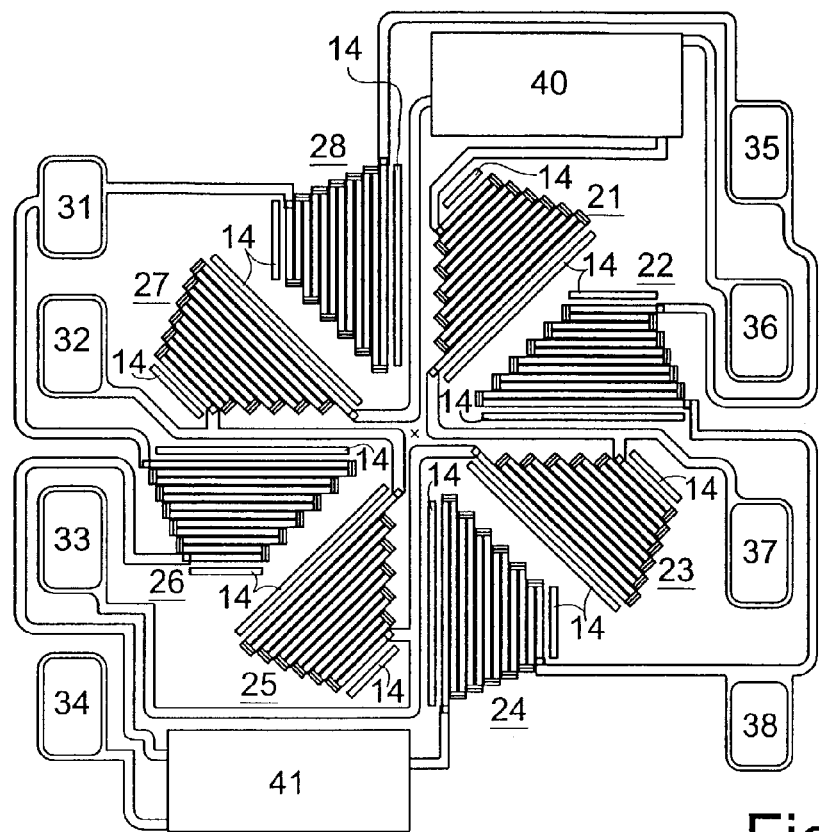
Figure 8:
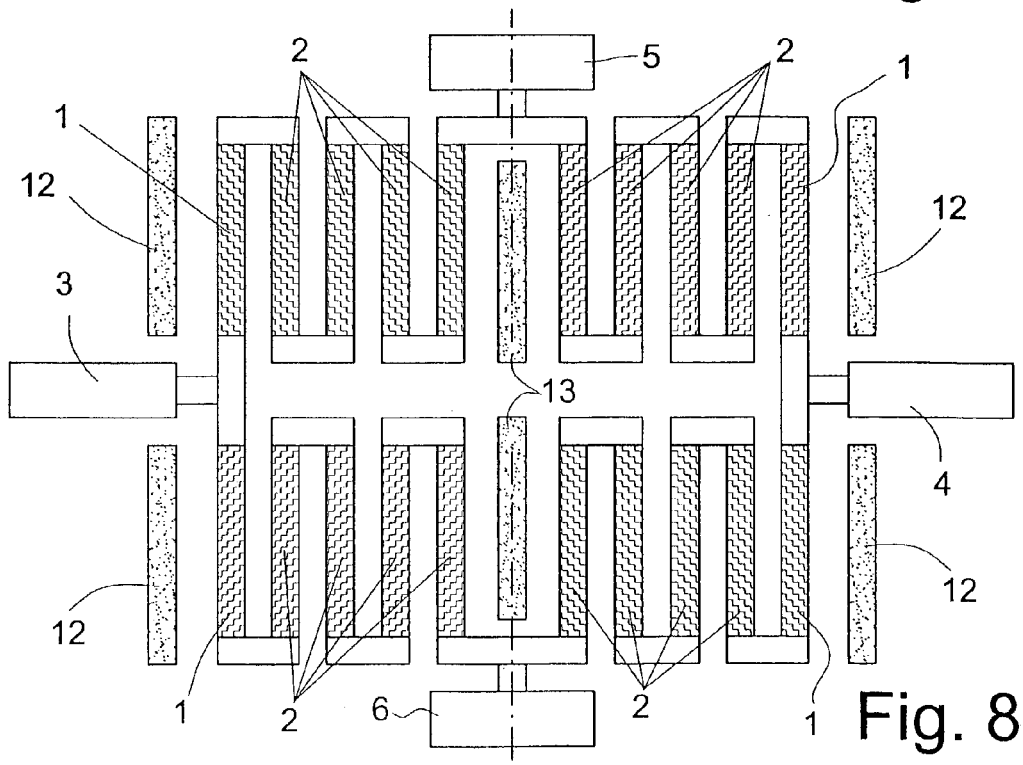

These and other aspects of the invention are apparent from and will be elucidated with reference to the embodiments described hereinafter. In the drawings, in which corresponding elements are provided with the same reference symbols:

FIG. 1 shows an example of a magnetoresistive sensor having conductor strips disposed parallel to one another, FIG. 2 shows a first exemplary embodiment of the invention in the case of a sensor in accordance with FIG. 1, FIG. 3 shows an example of a hysteresis characteristic curve pattern of a conductor extending in the "interior" of the arrangement of conductors of the sensor according to FIG. 1, FIG. 4 shows an example of the hysteresis characteristic curve pattern of a peripheral strip of the arrangement of conductors in the sensor according to FIG. 1, FIG. 5 shows a diagrammatic representation of the characteristic curve of sensors in the comparison between an arrangement with (cf. FIG. 2) and without screening strips (cf. FIG. 1), FIG. 6 shows a diagrammatic representation of domain formation in magnetoresistive conductor strips in a sensor of FIG. 1 or FIG. 2, FIG. 7 shows an angle sensor as second exemplary embodiment of the invention, and FIG. 8 shows a sensor in a modification of the configuration according to FIG. 2 as a third exemplary embodiment of the invention.

FIG. 1 shows diagrammatically the structure of a magnetoresistive sensor of the known type in a plan view of its conductor structure. The sensor comprises an arrangement of a plurality of strip-shaped conductors 1, 2 that are formed from magnetoresistive material, that extend in two rows essentially parallel to one another and of which the marginal conductors provided with the reference symbol 1 form a boundary of the arrangement of the conductors and therefore are described as peripheral strips, whereas the other conductors provided with the reference symbol 2 are bounded on all sides by at least another of the conductors 1 or 2, that is to say they extend in the "interior" of the arrangement of the conductors and are therefore described below as internal conductors. Four adjacent conductors of the internal conductors 2 in each case and a peripheral strip 1 adjacent to them in each of the rows of the conductors are connected electrically to one another in the example shown and represent a branch of an electric circuit constructed as a Wheatstone bridge. Said Wheatstone bridge is provided with two terminals 3, 4, via which a supply voltage is applied during operation, and also with two further terminals 5, 6, via which an output voltage can be tapped that forms an output signal of the sensor.

FIG. 3 shows diagrammatically an example of a hysteresis characteristic line shown as the dependence of the magnetic induction B developed on the field strength H of the applied magnetic field, as results for one of the internal conductors 2 of the sensor according to FIG. 1. This hysteresis characteristic curve of the internal conductor 2 of the sensor has a very steep pattern with a clear, reproducible hysteresis behavior.

In comparison to the latter, FIG. 4 shows a diagrammatic representation of an example of such a hysteresis characteristic curve of the magnetic induction B developed as a function of the field strength H of the applied magnetic field, such as results for a peripheral strip 1 of the sensor according to FIG. 1. Said hysteresis characteristic curve of the peripheral strip 1 of the sensor exhibits a more flatly inclined pattern. The hysteresis behavior described thereby is far less clear and reproducible.

The domain formation with the superimposition of the switching behavior, resulting therefrom, of different individual domains, which domain formation is recognized as the cause of said more flatly inclined pattern of the hysteresis characteristic curve of the peripheral strip 1 of the sensor according to FIG. 1, is shown diagrammatically on the basis of FIG. 6. In the latter, the reference symbol 7 denotes a trimming structure as an example of an external conductor arrangement that influences the domain formation in the peripheral strip 1 by means of its demagnetizing field. In said peripheral strip 1, further domain walls 8, 9 are formed in addition to a terminal domain wall 10. The segments of the peripheral strip 1 that are separated by them and are described as domains have different behavior, i.e. depend differently on the electrical resistance on the field strength of the applied magnetic field. As a result, the peripheral strip 1 exhibits a hysteresis characteristic curve deviating from that of the internal conductor 2.

In other respects, a mutual influencing of the peripheral strip 1 and of the trimming structure 7 also produces in the latter domain walls, denoted diagrammatically here by the reference numeral 11, which are, however, not of essential importance for the invention.

FIG. 5 shows, in a diagrammatic representation, the characteristic curve of a sensor in accordance with FIG. 1 as a broken line S1. The output voltage UA of the sensor between the terminals 5 and 6 is plotted against the magnetic field strength H of the applied magnetic field. In the region of the transition of said characteristic curve pattern S1 into the characteristic curve segments, plotted against the magnetic field strength H of the applied magnetic field, of constant output voltage UA of the sensor, which characteristic curve segments are described as saturation and extend horizontally, marked roundings of the characteristic curve are exhibited that markedly constrict the center segment of the characteristic curve in which there is an at least largely linear relationship between the output voltage UA of the sensor and the magnetic field strength H of the applied magnetic field.

FIG. 2 shows diagrammatically a first exemplary embodiment of the invention, which is based on the arrangement of the sensor according to FIG. 1. In contrast to the latter, the sensor according to FIG. 2 is provided with additional screening strips 12 of which one in each case is disposed adjacent to one peripheral strip 1 in each case and extends parallel thereto, but is electrically separated from the latter. Said screening strips 12 achieve the result that a domain formation as in FIG. 6 for one of the peripheral strips 1 is now no longer exhibited in said peripheral strip 1, but, on the contrary, takes place in the adjacent screening strip 12 extending parallel thereto. On the other hand, the peripheral strip 1 now behaves magnetically like one of the internal conductors 2, that is to say no longer exhibits a domain formation, apart from the formation of the terminal domains 10, which is the same for all the conductors. All the conductors 1, 2 electrically connected together to form the sensor now exhibit the same magnetic behavior.

Preferably, in the arrangement of said sensor according to FIG. 2, the spacings a, shown therein differently for the sake of clarity, of the screening strips 12 from the peripheral strips 1 adjacent to them are mutually equal to the spacings b of every two mutually adjacent conductors of the internal conductors 2 or that of the peripheral strips 1 from the internal conductors 2 adjacent to them. Furthermore, the spacings c of the mutually adjacent internal conductors 2 of different branches of the Wheatstone bridge are also preferably equal to the spacings a and b.

In the sensor arrangement of FIG. 2, all the conductors 1, 2 electrically connected to form the sensor exhibit a hysteresis characteristic curve in accordance with FIG. 3, having a steep pattern. FIG. 5 shows, in addition, the characteristic curve S2 of the output voltage UA of the sensor according to FIG. 2 plotted against the magnetic field strength H of the applied magnetic field, with the result that FIG. 5 shows a comparison of the characteristic curve S1 of the conventional sensor with that of the sensor according to the invention. The characteristic curve S2 of the sensor according to the invention is shown in FIG. 5 as a solid line and has at least largely sharp bends in the transitions between the linear region and saturation, i.e. the linear region of this characteristic curve S2 is substantially expanded compared with the characteristic curve S1 of the conventional sensor.

FIG. 7 shows, as a second exemplary embodiment of the invention, an angle sensor that is known per se in its basic structure and will therefore not be explained more precisely in detail. In said angle sensor, the conductors of magnetoresistive material are distributed over a total of eight branches 21 to 28 that are electrically interconnected in two Wheatstone bridges disposed in a spatially interleaved way. The Wheatstone bridges can be acted on by supply voltages via eight terminals 31 to 38 or output voltages of the Wheatstone bridle can be tapped off via said terminals. In addition, a trimming structure 40 or 41, respectively, shown in block diagram form, which serves to electrically balance the Wheatstone bridge connected to it for each of the Wheatstone bridges and that is inserted into the connections of the terminals 36 or 34, respectively, to the branches 21 and 27 or 24 and 26. Each of the eight branches 21 to 28 comprises a plurality of magnetoresistive conductors that extend parallel to one another and that are electrically connected in series with one another, the spatial alignment of said conductors being offset from branch to branch by a predetermined angle—in this case 45°—in such a way that all the branches 21 to 28 form in total a rotationally symmetrical arrangement.

In each of the eight branches 21 to 28, the conductors electrically interconnected to form the sensor are bounded by screening strips 14 that are distributed on both sides of each of the eight branches 21 to 28 parallel to their outer conductors, i.e. their peripheral strips. In the sensor constructed in this way, each of the individual branches 21 to 28 is consequently provided with a separate screen. Further screens, not shown, of the branches 21 to 28 can be provided in this arrangement, for example along the ends of the individual conductors of each of the branches and, consequently, largely transversely to the longitudinal direction of said conductors. Such additional screens may preferably be constructed with screening strips whose shape corresponds to that of the screening strips 14 and that are disposed, in particular, in a likewise electrically separated way from the latter.

In a modification of the configuration in FIG. 2, which modification is based on the second exemplary embodiment according to FIG. 7, FIG. 8 shows a third exemplary embodiment of the invention in which, in the configuration of FIG. 2 otherwise adopted in an identical way, additional screening strips 13 are provided that extend parallel to the mutually adjacent internal conductors 2 of different branches of the Wheatstone bridge between the latter and effect a screening of the branches from one another.

LIST OF REFERRENCE SYMBOLS

1 Peripheral strip=marginal sensor conductor formed from a magnetoresistive material
2 Internal conductor=conductor in the interior of the sensor formed from a magnetoresistive material
3 Wheatstone bridge terminal for applying a supply voltage
4 Wheatstone bridge terminal for applying a supply voltage
5 Wheatstone bridge terminal for tapping off the output voltage UA forming the output signal of the sensor 6 Wheatstone bridge terminal for tapping off the output voltage UA forming the output signal of the sensor
7 Trimming structure as an example of an external conductor arrangement
8 Further domain wall
9 Further domain wall
10 Terminal domain wall
11 Domain wall in the trimming structure 7
12 Screening strip
13 Additional screening strips parallel to and between the mutually adjacent internal conductors 2 of different branches of the Wheatstone bridge
14 Screening strips for each of the eight branches 21 to 28 of the sensor according to FIG. 7
21 Branch of the angle sensor according to FIG. 7 having conductors of magnetoresistive material as part of one of two Wheatstone bridges disposed in a spatially interleaved way
22 Branch of the angle sensor according to FIG. 7 having conductors of magnetoresistive material as part of one of two Whetstone bridges disposed in a spatially interleaved way
23 Branch of the angle sensor according to FIG. 7 having conductors of magnetoresistive material as part of one of two Wheatstone bridges disposed in a spatially interleaved way
24 Branch of the angle sensor according to FIG. 7 having conductors of magnetoresistive material as part of one of two Wheatstone bridges disposed in a spatially interleaved way
25 Branch of the angle sensor according to FIG. 7 having conductors of magnetoresistive material as part of one of two Wheatstone bridges disposed in a spatially interleaved way
26 Branch of the angle sensor according to FIG. 7 having conductors of magnetoresistive material as part of one of two Wheatstone bridges disposed in a spatially interleaved way
27 Branch of the angle sensor according to FIG. 7 having conductors of magnetoresistive material as part of one of two Wheatstone bridges disposed in a spatially interleaved way
28 Branch of the angle sensor according to FIG. 7 having conductors of magnetoresistive material as part of one of two Wheatstone bridges disposed in a spatially interleaved way
31 Wheatstone bridge terminal for applying a supply voltage or for tapping off an output voltage of the Wheatstone bridge
32 Wheatstone bridge terminal for applying a supply voltage or for tapping off an output voltage of the Wheatstone bridge
33 Wheatstone bridge terminal for applying a supply voltage or for tapping off an output voltage of the Wheatstone bridge
34 Wheatstone bridge terminal for applying a supply voltage or for tapping off an output voltage of the Wheatstone bridge
35 Wheatstone bridge terminal for applying a supply voltage or for tapping off an output voltage of the Wheatstone bridge
36 Wheatstone bridge terminal for applying a supply voltage or for tapping off an output voltage of the Wheatstone bridge
37 Wheatstone bridge terminal for applying a supply voltage or for tapping off an output voltage of the Wheatstone bridge
38 Wheatstone bridge terminal for applying a supply voltage or for tapping off an output voltage of the Wheatstone bridge
40 Trimming structure in the connection of the terminal 36 to the branches 21 and 27
41 Trimming structure in the connection of the terminal 34 to the branches 24 and 26
a Spacings of the screening strips 12 from the peripheral strips 1 adjacent to them
b Mutual spacings of two mutually adjacent internal conductors 2 in each case or of the peripheral strips 1 to the internal conductors 2 adjacent to them
c Spacings of the mutually adjacent internal conductors 2 of different branches of the Wheatstone bridge
B Magnetic induction
H Magnetic field strength of the applied magnetic field
S1 Characteristic curve of the output voltage UA against the magnetic field strength H of the applied magnetic field for a sensor in accordance with FIG. 1
S2 Characteristic curve of the output voltage UA against the magnetic field strength H of the applied magnetic field for a sensor in accordance with FIG. 2
UA Output voltage of the sensor between the terminals 5 and 6

The invention claimed is:

1. A magnetoresistive sensor comprising:
an electric circuit comprising a plurality of branches, wherein each of the plurality of branches comprises:
an arrangement of at least two strip-shaped conductors formed from a magnetoresistive material and extending essentially parallel to one another and of which at least one of the conductors comprises a peripheral strip that forms a boundary of the arrangement of conductors, wherein the arrangement of conductors is bounded by at least one screening strip disposed at least substantially parallel to and at a predetermined spacing from the at least one peripheral strip and electrically separated therefrom;
wherein at least one of the screening strips is shared by two of the branches of the electric circuit.

2. A magnetoresistive sensor as claimed in claim 1, wherein substantially all of the conductors of all of the branches of the electric circuit are disposed at least essentially parallel to one another.

3. A magnetoresistive sensor as claimed in claim 2, wherein the predetermined spacings of the at least one screening strip from the at least one peripheral strip are mutually equal at least substantially to the spacings of at least two of the conductors, extending essentially parallel to one another.

* * * * *